United States Patent
Eitan et al.

(10) Patent No.: US 7,557,036 B2
(45) Date of Patent: Jul. 7, 2009

(54) METHOD, SYSTEM, AND APPARATUS FOR FILLING VIAS

(75) Inventors: Amram Eitan, Scottsdale, AZ (US); Dingying Xu, Maricopa, AZ (US)

(73) Assignee: Intel Corporation, Santa Clara, CA (US)

( * ) Notice: Subject to any disclaimer, the term of this patent is extended or adjusted under 35 U.S.C. 154(b) by 226 days.

(21) Appl. No.: 11/394,856

(22) Filed: Mar. 30, 2006

(65) Prior Publication Data

US 2007/0235840 A1    Oct. 11, 2007

(51) Int. Cl.
    *H01L 21/44* (2006.01)
(52) U.S. Cl. .............................. 438/667; 257/E21.597; 257/E21.585
(58) Field of Classification Search ................ 438/460, 438/637–640, 675, 672, 667, 674, 123, 650, 438/677, 668, 629, 630; 257/621, 164, E21.597, 257/774, 775, E23.011, 276, E21.585; 427/585; 29/852
    See application file for complete search history.

(56) References Cited

U.S. PATENT DOCUMENTS

| | | | | |
|---|---|---|---|---|
| 4,751,562 A | * | 6/1988 | Yamamura | 257/276 |
| 4,849,800 A | * | 7/1989 | Abbas et al. | 257/164 |
| 5,744,758 A | * | 4/1998 | Takenouchi et al. | 174/255 |
| 5,840,417 A | * | 11/1998 | Bolger | 428/323 |
| 6,841,883 B1 | * | 1/2005 | Farnworth et al. | 257/777 |
| 6,886,248 B2 | * | 5/2005 | Watanabe et al. | 29/852 |
| 7,199,449 B2 | * | 4/2007 | Lake | 257/618 |
| 2002/0076848 A1 | * | 6/2002 | Spooner et al. | 438/48 |
| 2004/0021153 A1 | * | 2/2004 | Nogome et al. | 257/202 |
| 2005/0059205 A1 | * | 3/2005 | Maki et al. | 438/232 |
| 2005/0090110 A1 | * | 4/2005 | Brouillette et al. | 438/694 |
| 2006/0009029 A1 | * | 1/2006 | Hua et al. | 438/637 |
| 2006/0043154 A1 | * | 3/2006 | Kirby et al. | 228/37 |
| 2006/0131998 A1 | * | 6/2006 | Aoki et al. | 310/340 |
| 2007/0275540 A1 | * | 11/2007 | Hackitt et al. | 438/460 |
| 2008/0017956 A1 | * | 1/2008 | Lu et al. | 257/666 |
| 2008/0092378 A1 | * | 4/2008 | Chujo et al. | 29/852 |

FOREIGN PATENT DOCUMENTS

| | | | | |
|---|---|---|---|---|
| JP | 11140280 | * | 5/1999 | |
| JP | 2001024035 A | * | 1/2001 | |

* cited by examiner

*Primary Examiner*—W. David Coleman
*Assistant Examiner*—Latanya Crawford
(74) *Attorney, Agent, or Firm*—Buckley, Maschoff & Talwalkar LLC

(57) ABSTRACT

A method, system, and apparatus, the method including, in some embodiments, applying a via filling material in a film format and at a first temperature to a backside of a silicon wafer having a plurality of vias therein, heating the via filling material to a second temperature to cause the via filling material to flow into and fill the plurality of vias, and applying a die attach material over the plurality of vias filled with the via filling material.

11 Claims, 5 Drawing Sheets

METHOD, SYSTEM, AND APPARATUS FOR FILLING VIAS

BACKGROUND

In an operation of processing a silicon wafer having a number of vias through the silicon wafer and attaching a die including the silicon wafer to a substrate, an air void may be introduced in one or more of the vias in a material used to fill the vias. The air void may result in an inconsistency in the operational characteristics of the device. For example, the vias through the silicon wafer may provide through wafer interconnects and conductive contacts on both sides of the wafer. An air void in the material filling the vias may result in a non-uniform ground or potential plane and electrical discontinuities.

In some instances, the number and distribution of the vias over an area of the silicon wafer may vary, thereby contributing to a complexity in filling the vias in a consistent manner.

Thus, there is a general need for an efficient and reliable via filling mechanism.

DETAILED DESCRIPTION

The several embodiments described herein are solely for the purpose of illustration. Embodiments may include any currently or hereafter-known versions of the elements described herein. Therefore, persons skilled in the art will recognize from this description that other embodiments may be practiced with various modifications and alterations.

Figure 1:
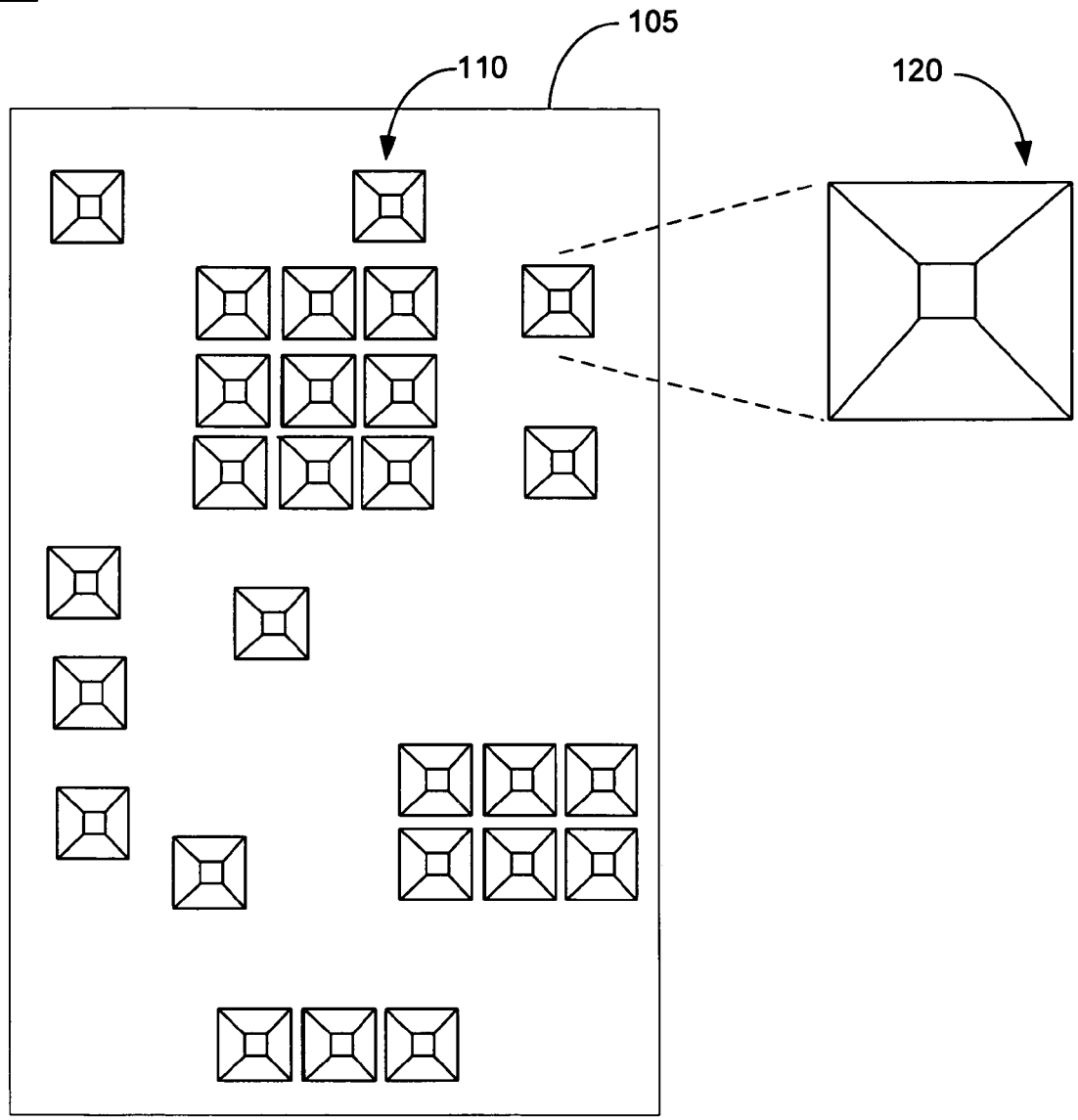
FIG. 1 is an exemplary illustration of a silicon wafer having a number of vias therethrough, in accordance with some embodiments herein.

FIG. 1 is an exemplary depiction of a device 100 having a number of vias therethrough, in accordance with some embodiments herein. In particular, there is shown a silicon wafer 105 having a number of vias 110 therethrough. The vias may be formed using a number of integrated circuit (IC) processing techniques and processes, including for example, a chemical etching process. For example, vias 110 may be chemically etched on a backside of silicon wafer 105 using a potassium hydroxide solution after a wafer thinning procedure of silicon wafer 105. A via filling material such as a conductive adhesive may be used to fill vias 110.

In some embodiments, the distribution of vias 110 is less than uniform over the area of silicon wafer 105. That is, more (or fewer) vias 110 may be located in one area of the wafer than other areas thereof. The particular distribution of vias 110 may be related to an intended application or use for device 100.

In some embodiments, vias 110 may have a substantially pyramidal shape wherein a base opening of vias 110 is larger than a top portion thereof. The pyramidal-shape of vias 110 and the non-uniform distribution thereof may contribute to increasing a complexity of an IC process to consistently and uniformly fill the vias with a gap or via filling material.

In some instances, the via filling material may not completely fill vias 110. In such instances, an air void may be introduced into the via. The air void may result in an inconsistency in the physical and operational characteristics of device 100. The air void may cause stresses at a local stress point. The stresses may negatively compromise the integrity of device 100. Operationally, the efficiency of device 100 may be reduced due to, for example, a conductive inconsistency in the area of the air void. Further, the presence of air voids may lead to internal cracking in the via filling material and/or induce delamination at an interface between the via filling material and an IC substrate. Such cracking and/or delamination may lead to a breakdown in electrical connectivity within an IC package (i.e., system).

FIGS. 2A-2J are exemplary illustrations of an apparatus at various stages of an IC processing flow, according to some embodiments herein. Device 200 includes a silicon wafer 205 having a number of vias 210 through a backside of the silicon wafer. In some embodiments, silicon wafer 210 may be thinned by an IC processing thinning operation. Silicon wafer 205 is adhered to a back grind film 215. Back grind film 215 may provide a mechanism for handling device 200 during a number of the IC processing operations herein. In some embodiments, vias 210 may be etched into silicon wafer 205.

In some embodiments, vias 210 are wider at a first opening end than at a second end. In some embodiments, the walls of vias 210 are lined with a conductive material. The conductive material may be a metal such as, for example, gold. In some embodiments, vias 210 through silicon wafer 205 may have a quantity of silicon at the end thereof that is adjacent to back grind film 215.

Figure 2A:
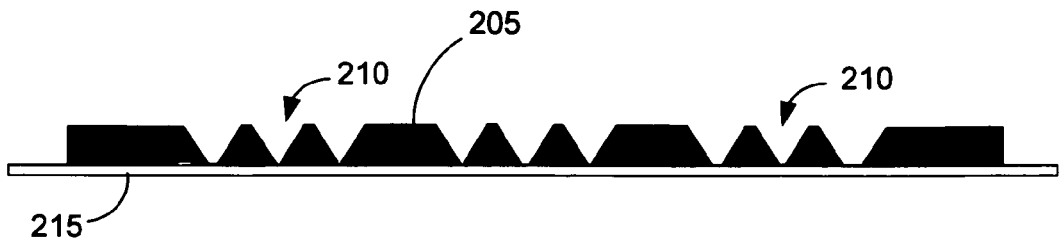
FIGS. 2A-2I are exemplary illustrations of an apparatus at various stages of manufacture, according to some embodiments herein.
Figure 2B:
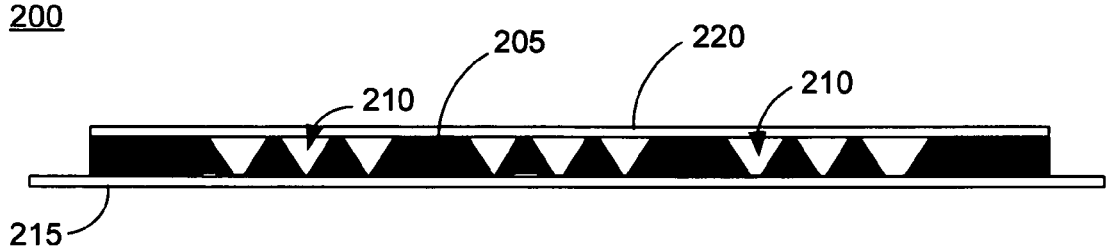

In FIG. 2B a via filling material 220 is applied to the backside of silicon wafer 205. Via filling material 220 is applied such that it covers vias 210 located in silicon wafer 205. In some embodiments, via filling material 220 is applied in the form of a film. The film format of via filling material 220 is achieved, at least in part, by controlling the temperature at which via filling material 220 is applied to device 200, as well as the temperature of the components of device 200. In some embodiments, via filling material 220 may be a non-cross linked polymer that has an initial glass transition temperature above about 65 degrees Celsius. With some such materials, at about or above 80 degrees Celsius the polymer chains are sufficiently mobile to cause the via filling material to flow. The increase in temperature to above about 80 degrees Celsius may cause via filling material 220 applied and positioned over vias 210 to flow into vias 210.

In some embodiments, via filling material 220 may be applied over the backside of silicon wafer 205 using an IC manufacturing lamination process. During the lamination process, a sufficient amount of pressure is used to apply the via filling material to silicon wafer 205 such that the film lies substantially flat (i.e., no significant wrinkles) over the surface of silicon wafer 205. The pressure used may be sufficient enough to avoid trapping excess air between via filling material 220 in a film format and silicon wafer 205. The lamination process may vary and may further be consistent with IC processing operations.

Figure 2C:
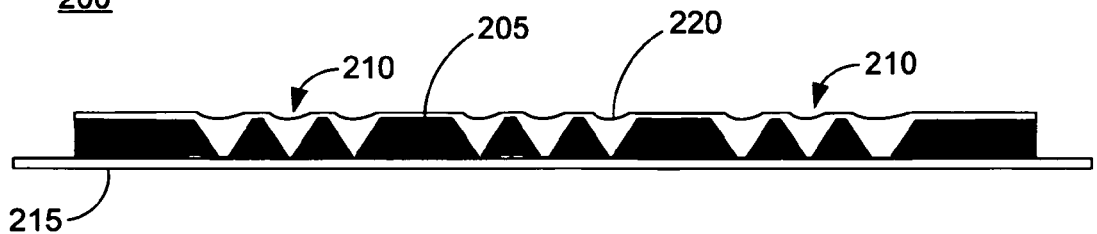

At FIG. 2C, device 200 is shown with via filling material 220 substantially filling vias 210. At FIG. 2C, the device is heated to a temperature that causes via filling material 220 to flow and fill vias 210. In some embodiments, the operation of heating includes uniformly heating the device to achieve a consistent and uniform filling of vias 210.

In some embodiments, via filling material 220 is heated from a first temperature of the processing stage shown in FIG. 2B where via filling material 220 is in a film format to a second temperature in FIG. 2C where via filling material 220 flows into vias 210. The viscosity of via filling material 220 is reduced upon a sufficient heating thereof. For example, heating device 200 including via filling material 220 to the second temperature may reduce the viscosity of the via filling material to a flowing state suitable for filling vias 210. In some embodiments, the temperature needed to cause via filling material 220 to flow is about 80 degrees Celsius. In some embodiments, via filling material 220 may include a non-cross linked polymer that has an initial glass transition temperature of about 65 degrees Celsius. In some embodiments herein, via filling material 220 is a conductive material.

In some embodiments, the heating of device 200 is controlled to induce the flow of via filling material 220. Further, the heating of device 200 is controlled to manage a curing process of via filling material 220.

In some embodiments, there may be a slight dimple in via filling material 220 at the wide top opening of vias 210. The slight dimple may be a result of, at least in part, a consumption of via filling material 220 by the vias and a cooling of via filling material 220. In some embodiments, via filling material 220 completely fills vias 210 without the presence of voids in the filled vias, including the narrower end of the vias.

Figure 2D:
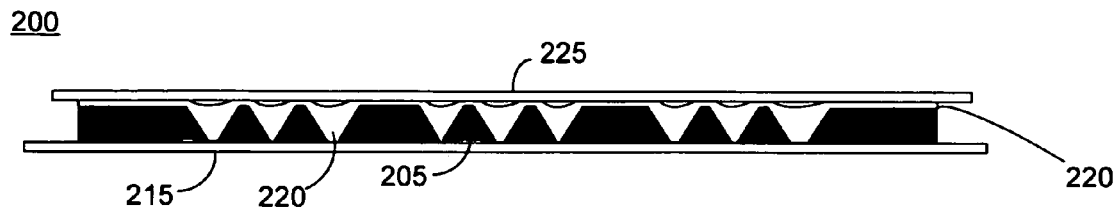
Figure 2E:
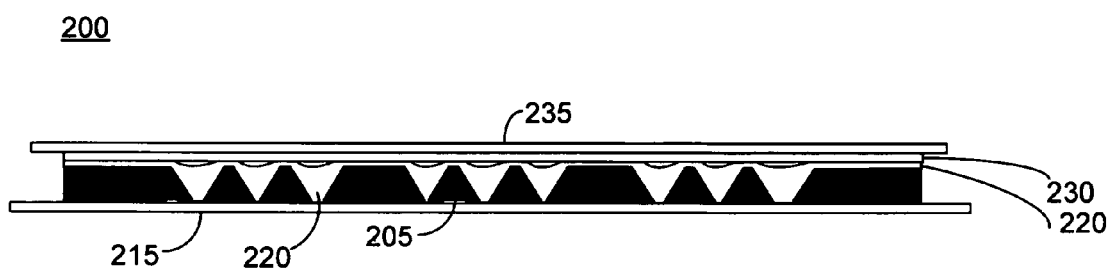

FIGS. 2D and 2E illustrate device 200 wherein a die attach material is applied thereto. The die attach material is applied over the backside of silicon wafer 205 and covers the vias filled with via filling material 220. The die attach material may be applied to device 200 using a lamination process.

In some embodiments, the die attach material is a dicing film 225, as shown in FIG. 2D. In some embodiments, the die attach material is an adhesive 230 and a dicing film 235, as shown in FIG. 2E. Dicing film 225 and dicing film 230 may be similar to each other. The dicing films are applied to device 200 in the form of a film. The inclusion of adhesive 230 may be used to vary a total thickness of the adhesive layer.

In some embodiments, adhesive 230 may have properties that are the same as or different than the properties of via filling material 220. In some embodiments, adhesive 230 may provide a degree of leveling action such the slight dimples and other surface variations in via filling material 220 may be leveled.

Figure 2F:
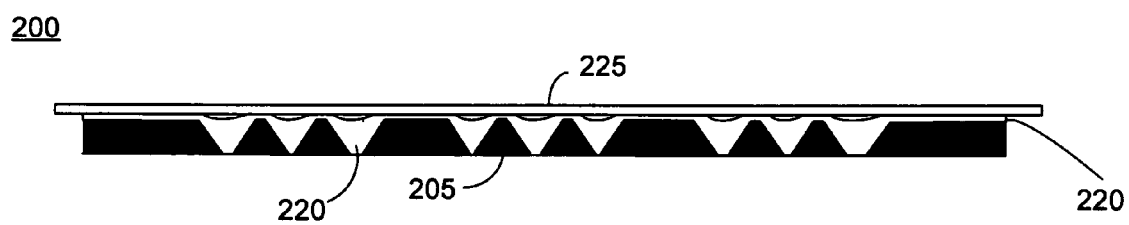
Figure 2G:
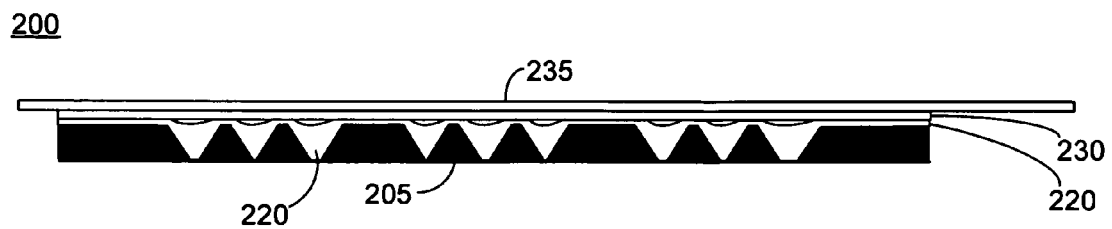

FIGS. 2F and 2G illustrate device 200 after a de-taping process that removes wafer back grind tape 215. FIG. 2F corresponds to FIG. 2D and FIG. 2G corresponds to FIG. 2E.

Figure 2H:
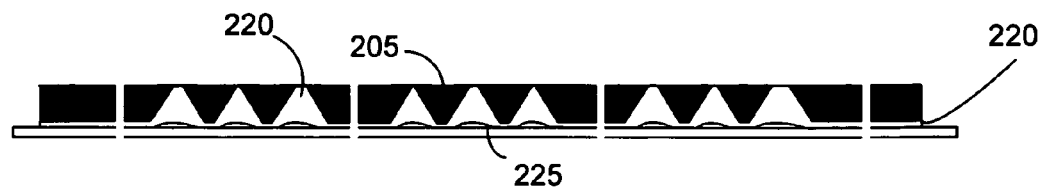
Figure 2I:

FIGS. 2H and 2I are exemplary depictions of device 200 wherein silicon wafer 205 is shown diced into a number of die size components. A wafer dicing tool may be used to dice silicon wafer 205. In some embodiments, the wafer dicing tool and the techniques of its use may be consistent or compatible with conventional IC processing techniques.

Figure 2J:
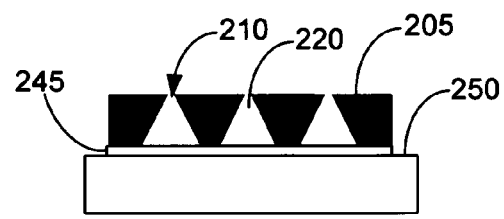

FIG. 2J is an exemplary illustration of a device wherein a die 240 formed in accordance with aspects herein is attached to a substrate 250. The device includes silicon wafer 205, via filling material 220 filling the vias of the die, and die attach material 245. In some embodiments, die attach material 245 may include a dicing film alone or a dicing film and an additional adhesive layer. Substrate 250 may include an IC, a printed circuit board, and other devices. In some embodiments, die 240 may be attached to substrate 250 using a combination of heat and pressure. The heat and pressure may assist in decreasing or eliminating any residual air void(s) trapped between adhesive layers (e.g., 220, 225, 230, 235, and 245) and/or substrate 250. In this manner, a void-free bondline may be created.

Figure 3:
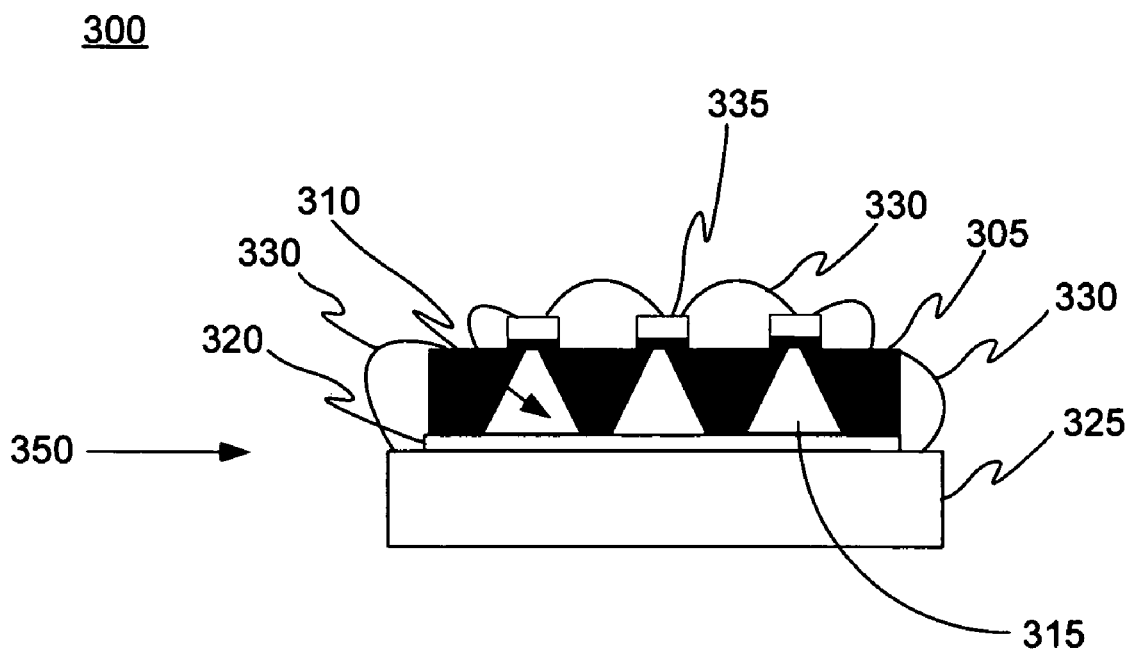
FIG. 3 is an exemplary depiction of a system, in accordance with some embodiments herein.

FIG. 3 is an exemplary depiction of a system 300, in accordance with some embodiments herein. System 300 includes a silicon die 350 with vias therein and a number of components 335 attached thereto. Silicon die 350 may include an IC device such as, for example, a RF (radio frequency) logic device. Components 335 may include a variety of electrical components such as, for example, an active RF device, to connect to silicon die 350. Silicon die 350 may include silicon wafer 305, via filling material 315 filling vias 310, die attach material 320, and a substrate 325. Also shown are a number of interconnect wires 330 to provide electrical connections between some of the various components of system 300.

In some embodiments, die attach material 320 may include a dicing film alone or a dicing film and an additional adhesive layer. Substrate 325 may include an IC substrate, a printed circuit board (PCB) laminate, and other devices such as a metal leadframe.

In some embodiments, silicon die 350 may include, for example, dual logic and memory functionality. It should be appreciated that other, additional, alternative, and lesser functionalities may be incorporated into silicon device 350.

In some embodiments, components 335 may generally include IC devices, including for example, an active RF device. Components 335 may comprise a GaAs or GaGe die. It should be appreciated that these and/or other IC devices may be interfaced with silicon die 350.

The foregoing disclosure has been described with reference to specific exemplary embodiments thereof. It will, however, be evident that various modifications and changes may be made thereto without departing from the broader spirit and scope set forth in the appended claims.

What is claimed is:

1. A method, comprising:
applying a via filling material in a film format and at a first temperature to a backside of a silicon wafer having a plurality of vias therein, the via filling material in the film format covering an open end of the vias, lying substantially flat over a surface of the backside of the silicon wafer, and not entering into the open end of the vias;
heating, after the applying of the via filling material in the film format and at the first temperature, the via filling material to a second temperature to cause the via filling material to flow into and fill the plurality of vias; and
applying a die attach material over the plurality of vias filled with the via filling material.

2. The method of claim 1, wherein the plurality of vias comprise ground through silicon vias (GTSVs).

3. The method of claim 1, wherein the via filling material exhibits film characteristics at the first temperature and exhibits flowing and self-leveling characteristics to fill the plurality of vias without voids therein at the second temperature.

4. The method of claim 1, wherein the via filling material comprises a conductive adhesive.

5. The method of claim 1, further comprising dicing the wafer into a plurality of dies.

6. The method of claim 1, further comprising curing the via filling material by cooling the via filling material from the second temperature to a cooler temperature.

7. The method of claim 1, wherein the applying of the via filling material and the applying of the die attach material comprises a lamination process.

8. The method of claim 1, wherein the via filling material is a non-cross linked polymer having an initial glass transition temperature above about 65 degrees Celsius.

9. The method of claim 1, wherein the die attach material is applied to the silicon wafer in at least one of a film format and a paste.

10. The method of claim 1, wherein the applying of the die attach material comprises applying a layer of a dicing film material in conjunction with the die attach material.

11. The method of claim 1, further comprising attaching at least one of the plurality of dies to an integrated circuit (IC) substrate.

* * * * *

UNITED STATES PATENT AND TRADEMARK OFFICE
CERTIFICATE OF CORRECTION

| | | |
|---|---|---|
| PATENT NO. | : 7,557,036 B2 | Page 1 of 1 |
| APPLICATION NO. | : 11/394856 | |
| DATED | : July 7, 2009 | |
| INVENTOR(S) | : Amram Eitan and Dingying Xu | |

It is certified that error appears in the above-identified patent and that said Letters Patent is hereby corrected as shown below:

Title Page, should read

(22) Filing Date: March 31, 2006

Signed and Sealed this
Seventh Day of June, 2016

Michelle K. Lee
*Director of the United States Patent and Trademark Office*